United States Patent [19]

Cho

[11] 4,411,060

[45] Oct. 25, 1983

[54] METHOD OF MANUFACTURING DIELECTRICALLY-ISOLATED SINGLE-CRYSTAL SEMICONDUCTOR SUBSTRATES

[75] Inventor: Kon H. Cho, West Windsor Township, Mercer County, N.J.

[73] Assignee: Western Electric Co., Inc., New York, N.Y.

[21] Appl. No.: 280,600

[22] Filed: Jul. 6, 1981

[51] Int. Cl.³ .............................................. H01L 21/76
[52] U.S. Cl. ................................. 29/576 W; 148/171; 148/172; 148/1.5
[58] Field of Search ............ 29/576 W; 148/171, 177, 148/1.5

[56] References Cited

U.S. PATENT DOCUMENTS

| | | | |
|---|---|---|---|
| 2,813,048 | 11/1957 | Pfann | 148/1 |
| 3,484,302 | 12/1969 | Maeda et al. | 148/1.5 X |
| 3,895,967 | 7/1975 | Anthony et al. | 148/1.5 |
| 3,988,757 | 10/1976 | Cline et al. | 357/13 |
| 4,017,341 | 4/1977 | Suzuki et al. | 148/174 |
| 4,079,506 | 3/1978 | Suzuki et al. | 29/576 W |
| 4,082,572 | 4/1978 | Anthony et al. | 148/1.5 |
| 4,268,348 | 5/1981 | Allison et al. | 29/576 W |

*Primary Examiner*—G. Ozaki
*Attorney, Agent, or Firm*—M. M. de Picciotto

[57] ABSTRACT

In the manufacture of integrated circuits, it is often necessary to prepare dielectrically-isolated single-crystal silicon regions to be used as substrates in which various circuit elements may be formed. These regions or substrates are formed by attaching a single-crystal silicon wafer (1) having a dielectrically-coated surface (2) to a second single-crystal silicon wafer (3) by means of an intermediate metallic layer (4) positioned therebetween. Using a heating process, e.g., a thermomigration process also referred to as temperature gradient zone-melting (TGZM) technique, the metallic layer (4) is removed through the second silicon wafer (3). This method substantially eliminates any bending or warpage of the dielectrically-isolated substrate (FIG. 1).

7 Claims, 10 Drawing Figures

METHOD OF MANUFACTURING DIELECTRICALLY-ISOLATED SINGLE-CRYSTAL SEMICONDUCTOR SUBSTRATES

TECHNICAL FIELD

The present invention relates to a method of manufacturing semiconductor integrated circuits, and more particularly to a method of manufacturing dielectrically-isolated single-crystal semiconductor regions for use as substrates for semiconductor integrated circuits.

BACKGROUND OF THE INVENTION

In the manufacture of certain types of semiconductor integrated circuits, it is necessary to prepare dielectrically-isolated single-crystal silicon substrates or dielectrically-isolated single-crystal regions within the body of a silicon wafer. Various circuit elements, such as transistors, diodes, capacitors, resistors, etc. may be formed in the single-crystal silicon regions and interconnected with each other to form a monolithic integrated circuit.

One prior art process for the preparation of dielectrically-isolated single-crystal silicon regions is described in U.S. Pat. No. 4,017,341 issued to T. Suzuki et al. wherein a silicon single-crystal wafer is used as starting material. A desired pattern is then formed on the surface of the wafer and an insulating silicon oxide film ($SiO_2$) is formed by a chemical vapor deposition method on the entire surface of the wafer. Next, a silicon polycrystalline layer is formed on the patterned surface of the wafer, i.e., on the $SiO_2$ film. The opposite surface of the single-crystal wafer, i.e., the non-patterned surface of the wafer, is then lapped, etched or polished up to a desired level resulting in a plurality of single crystal island regions electrically isolated from one another and embedded in a silicon polycrystalline support with a $SiO_2$ film interposed therebetween. The foregoing known process results in a dielectrically-isolated substrate exhibiting some curvature or warpage partially due to the difference in thermal coefficients between the single-crystal wafer and the polycrystalline layer. In other words, the thermal mismatch between the original wafer and the deposited polycrystalline silicon tends to warp the resulting structure. The latter cannot be uniformly polished in any subsequent polishing step resulting in an uneven contact between the polished single-crystal wafer and any photoresist mask required for the diffusion of various circuit elements of an integrated circuit.

Another known method of preparing dielectrically-isolated regions in a substrate which exhibits less curvature or warpage than a substrate formed in accordance with the above-described known process is disclosed in U.S. Pat. No. 4,079,506 issued to T. Suzuki et al. In such a known technique, a plurality of silicon single-crystal regions are supported by a laminated structure comprising an alternate stacking of silicon oxide films and silicon polycrystalline layers. A silicon oxide film is interposed between the single-crystal regions or islands and the multiple layer support structure for isolating the regions from one another as well as from the support structure. According to this known method, the formation of three to twelve silicon polycrystalline layers in the support structure can reduce bendings of the substrate resulting from the growth stress of the polycrystalline layers or from the difference in thermal expansion coefficients between the single crystal silicon and the polycrystalline layers. Although this known technique appears to solve the bending or warpage problem, the use of such an alternate multiple layer structure results in a delicate, time consuming, as well as expensive method for manufacturing isolated single-crystal regions. Moreover, the deposition of the polycrystalline layers takes place at high temperatures capable of deleteriously affecting the characteristics of the silicon-single crystal regions.

SUMMARY OF THE INVENTION

The foregoing problems are solved in accordance with the present invention wherein the method of manufacturing a dielectrically-isolated single-crystal semiconductor substrate for semiconductor integrated circuits comprises joining a dielectrically-coated major surface of a first single-crystal semiconductor wafer and a major surface of a second single-crystal semiconductor wafer by means of an intermediate thin metallic body positioned therebetween; and heating the joined structure to remove the metal of the thin metallic body through the second wafer away from the dielectrically-coated major surface.

In one embodiment of the invention, the method of manufacturing a dielectrically-isolated single-crystal semiconductor substrate for semiconductor integrated circuits comprises the steps of joining a dielectrically-coated major surface of a first single-crystal semiconductor wafer and a major surface of a second single-crystal semiconductor wafer by means of an intermediate thin metallic body positioned therebetween, and thermomigrating the metal of the thin metallic body through the second wafer. Since both semiconductor wafers are of the single-crystal type, there is no thermal coefficient mismatch therebetween. Furthermore, the temperatures of the first wafer during the joining and the thermomigrating steps remain relatively low resulting in practically no deleterious effect on its characteristics.

In accordance with another embodiment of the invention, the method for manufacturing dielectrically-isolated single-crystal regions comprises the steps of joining a first single-crystal semiconductor wafer having a dielectrically-coated major surface with spaced-apart grooves therein to a second single-crystal semiconductor wafer by means of an intermediate thin metallic body positioned therebetween, thermomigrating the metal of the thin metallic body through the second wafer, and removing material from the surface opposite the grooved major surface of the first wafer until the spaced-apart grooves are exposed. The advantages of the above one embodiment, namely no thermal mismatch between the two wafers and no changes in characteristics of the first wafer, also exist in this other embodiment of the invention.

In one illustrative embodiment of the invention, the metallic body comprises a thin metallic layer formed on the major surface of the second single-crystal semiconductor wafer. In another illustrative embodiment of the invention, the metallic body is a thin metallic layer formed on the dielectrically-coated major surface of the first single-crystal semiconductor wafer. In any one of the above embodiments, the wafers joining step comprises the steps of contacting the dielectrically-coated major surface of the first wafer with the major surface of the second wafer, and heating the contacted structure including the first and second wafers to a temperature above the eutectic temperature of the metallic body (or layer positioned therebetween) and the semiconductor material of the second wafer.

In accordance with a further embodiment of the present invention, a semiconductor structure comprises a first layer including a single-crystal semiconductor body, a second layer including dielectric material adjoining the first layer, and a third layer adjoining the second layer and including a second single-crystal semiconductor body. The first layer may comprise a plurality of single-crystal islands isolated from each other and each isolated from the third layer by means of the second layer.

DETAILED DESCRIPTION

Figure 1:
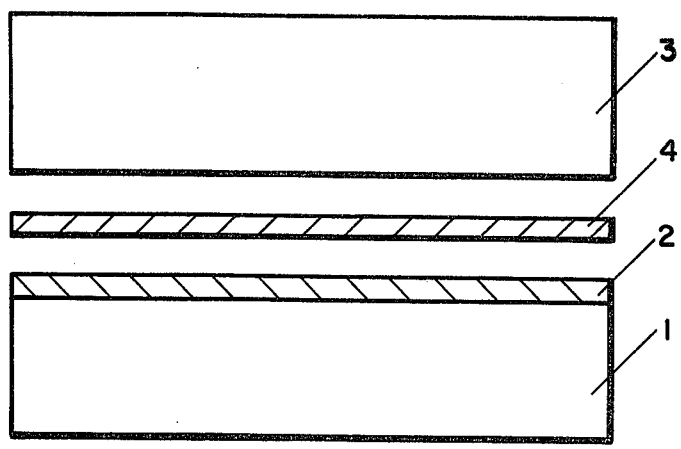
FIGS. 1 to 4 are sectional views sequentially showing steps of a process for the preparation of a dielectrically-isolated substrate according to one embodiment of the present invention.

Shown in FIG. 1 is an exploded view of the various elements used as starting materials in one embodiment of the present method for fabricating a dielectrically-isolated semiconductor substrate. A single-crystal semiconductor wafer 1, of about 500 μm in thickness, has a major surface coated with a thin dielectric film 2, e.g., a silicon oxide film. Film 2 may be formed on the major surface of wafer 1 via a chemical vapor deposition process, a thermal-oxidation method, or any other known oxide-forming method. Also shown in FIG. 1 is a second single-crystal semiconductor wafer 3 having a pair of parallel major surfaces and having a thickness of about 500 μm. Interposed between one major surface of wafer 3 and the dielectrically-coated surface of wafer 1 is a thin metallic body 4. Illustratively, wafers 1 and 3 are single-crystal silicon wafers and body 4 is in the form of a thin aluminum sheet or foil of few mils in thickness. However, metallic body 4 may be a thin metallic layer deposited on wafer 3 or on dielectric film 2 as will be explained hereunder in connection with FIGS. 9 and 10.

Figure 2:
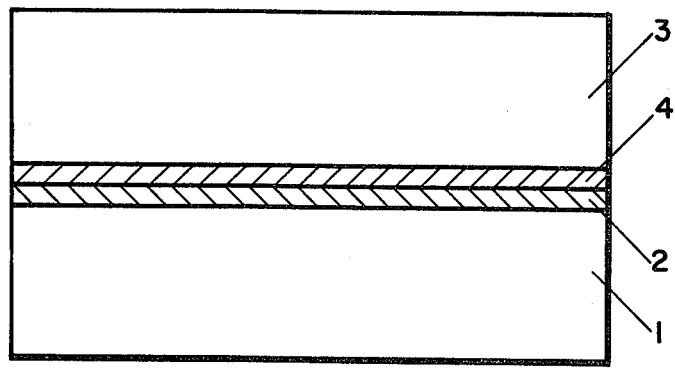

In accordance with an embodiment of the invention, wafers 1 and 3 are joined together with the thin metallic body 4 positioned therebetween. The joined structure shown in FIG. 2 is achieved by first contacting the dielectrically-coated surface of wafer 1 with the major surface of wafer 3 with body 4 interposed therebetween. Next, the contacted structure is heated to a temperature above the eutectic temperature of the metal of body 4 and the semiconductor of wafer 3, the molten metal body 4 acting as a gluing agent between the two wafers 1 and 3. In order to improve the adherence between the wafers and the metallic body, the various surfaces to be joined may be cleaned prior to bringing them into contact with each other. The thus joined structure is then cooled resulting in a multilayer structure comprising a first layer (i.e., wafer 1), a second layer (i.e., dielectric film 2), a third layer (i.e., metallic body 4), and a fourth layer (i.e., wafer 3). Alternatively, the following next step of the present method can start without cooling the joined structure.

Figure 3:
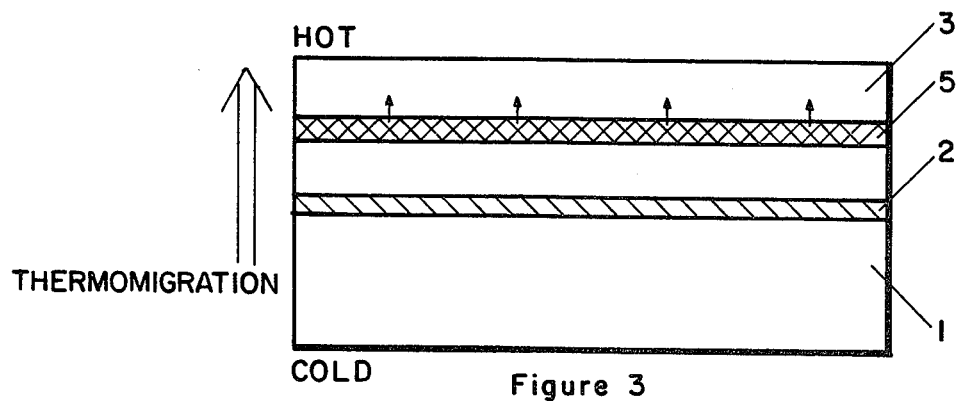

The next step in the present method consists in heating the joined structure of FIG. 2 to remove the metallic body or material 4 through the second wafer 3 away from dielectric film 2. In accordance with an illustrative embodiment of the invention, metallic body 4 is removed through wafer 3 by means of a known thermomigration process, also called temperature gradient zone-melting (TGZM) technique described in U.S. Pat. No. 2,813,048 to W. G. Pfann. In such a known process, the joined structure of FIG. 2 is exposed to a temperature gradient at an elevated temperature. The temperature distribution is such that the first wafer 1 is kept cold while the second wafer 3 is hot. The overall temperature at which this process is carried out is sufficiently high in order to form a metal-rich liquid zone 5 shown in FIG. 3 in the form of a line or sheet. This liquid zone 5 is caused to migrate in the direction of the arrows through the semiconductor wafer 3 from the cooler end of the structure to the hotter end thereof leaving in its path a recrystallized region of semiconductor material containing the metal and solid solution within the semiconductor material in a predetermined concentration. The metal present in wafer 3 at the end of the thermomigration process does not affect the properties of the isolated semiconductor substrate or wafer 1. At most, the conductivity and doping of wafer 3 is somewhat modified after the completion of the thermomigration process. The choice of aluminum as intermediate metallic body is advantageous for several reasons. First, due to its low melting point of about 650° C. and an eutectic temperature with silicon of about 610° C., aluminum is an excellent joining or gluing agent for the two wafers 1 and 3. Second, since aluminum is often used as a p-type dopant for n-type silicon, the presence of aluminum in wafer 3 at the end of the thermomigration process merely changes its conductivity. Also, by keeping the first wafer 1 on the cold side of the temperature gradient, its properties are not affected by the thermomigration step. One example of an apparatus for carrying out this known thermomigration process is described in U.S. Pat. No. 3,895,967 issued to T. R. Anthony et al. However, other known TGZM arrangements may be used without departing from the spirit and scope of the present invention.

Figure 4:
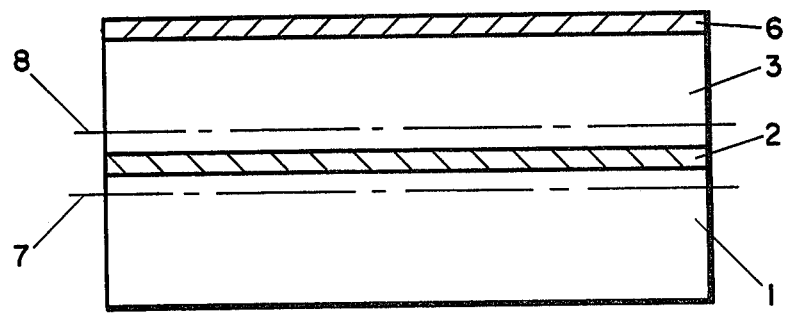

FIG. 4 shows the four layer structure after the end of the thermomigration process. The structure shown comprises the first single-crystal wafer 1, the dielectric film 2, the second single-crystal wafer 3 having a somewhat modified conductivity due to the presence of metal therein, and the thermomigrated metal layer 6. Depending upon the type of single-crystal semiconductor substrate desired for further processing of integrated circuits, material can be removed from such a multilayer structure along lines 7 or 8 or both. Indeed, in the event that wafer 1 is to be used as the isolated substrate, semiconductor material is removed from wafer 1 along line 7 leaving a thin layer of single-crystal semiconductor material on top of dielectric film 2. In such case, dielectric film 2, wafer 3 and metallic layer 6 act as support for the single-crystal substrate. Optionally, the thermomigrated layer 6 may be removed leaving dielectric film 2 and single-crystal wafer 3 as support for the single-crystal substrate.

On the other hand, if single-crystal wafer 3 is to be used as the isolated substrate for further integrated circuits processing, material is to be removed from the structure along line 8 leaving a thin layer of p-doped single-crystal semiconductor substrate on top of dielectric film 2. In such case, dielectric film 2 and single-crystal wafer 1 act as support for the single-crystal substrate. Optionally, a portion of single-crystal wafer 1 may also be removed along line 7 in FIG. 4. The foregoing step for removing material along lines 7, or 8, or both, may be an etching, lapping, polishing or other well known processes or any combination thereof.

Figure 5:
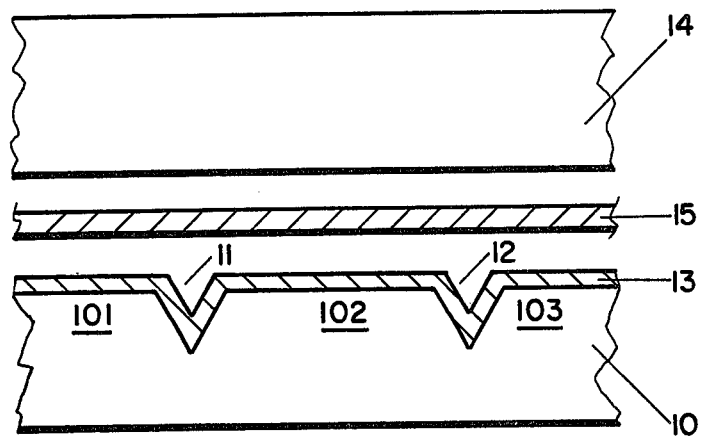
FIGS. 5 to 8 are sectional views sequentially showing steps of a process for the preparation of dielectrically-isolated single-crystal regions according to another embodiment of the present invention.

Another embodiment of the present invention is shown in FIG. 5 wherein a single-crystal semiconductor wafer 10, of about 500 µm in thickness, has a series of spaced-apart grooves on one of its major surfaces. For clarity purposes, only two grooves 11 and 12 are shown on the major surface of wafer 10. These grooves may be part of a grid or series of grooves resulting in an array of semiconductor regions 101, 102 and 103 within the wafer 10. Grooves, such as 11 and 12, may be formed by an etching process or by any other technique well known in the art. The grooved major surface of wafer 10 is coated with a thin dielectric film 13, e.g., a silicon oxide film. Film 13 may be formed on the grooved major surface of wafer 10 via a chemical vapor deposition process, a thermal-oxidation method, or any other known oxide-forming method.

Also shown in FIG. 5 is a second single-crystal semiconductor wafer 14 similar to wafer 3 of FIG. 1, having a pair of parallel major surfaces and having a thickness of about 500 µm. Interposed between one major surface of wafer 14 and the dielectrically-coated grooved surface of wafer 10 is a thin metallic body 15. Illustratively, wafers 10 and 14 are single-crystal silicon wafers and body 15 is in the form of a thin aluminum sheet or foil of few mils in thickness.

Figure 6:
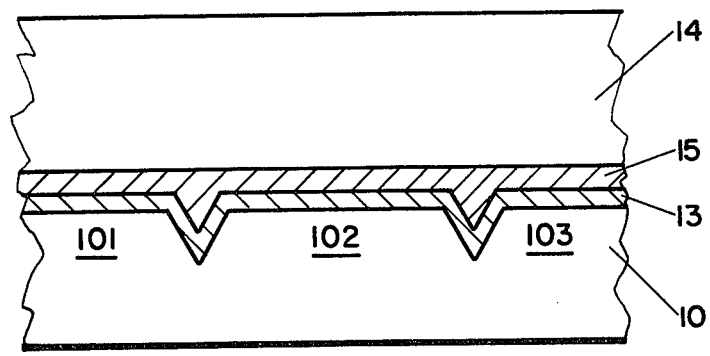

Wafers 10 and 14 are joined together with the thin metallic body 15 positioned therebetween. The joined structure shown in FIG. 6 is achieved in a manner similar to that shown in FIG. 2. In other words, first the dielectrically-coated grooved surface of wafer 10 is contacted with the major surface of wafer 14 and with body 15 interposed therebetween. Next, the contacted structure is heated to a temperature above the eutectic temperature of the metal of body 15 and the semiconductor of wafer 14. The molten metal body 15 acts as a gluing agent between the two wafers 10 and 14. Furthermore, as shown in FIG. 6, metallic body 15 fills the dielectrically-coated grooves 11 and 12 with metal. In order to improve the adherence between the wafers and the body, the various surfaces to be joined may be cleaned prior to bringing them into contact with each other. The thus joined structure is cooled resulting in a multilayer structure comprising a first layer (i.e., wafer 10), a second layer (i.e., dielectric film 13), a third layer (i.e., metallic body 15), and a fourth layer (i.e., wafer 14). Alternatively, the following next step can start without cooling the joined structure.

The next step in this other embodiment of the method consists in removing the metallic body or material 15 out of the joined structure of FIG. 6. Metallic body 15 is removed through wafer 14 by means of a thermomigration process of the type described above in connection with FIG. 3. Thus, the joined structure of FIG. 6 is exposed to a temperature gradient at an elevated temperature, and the temperature distribution is such that the first wafer 10 is kept cold while the second wafer 14 is hot. The overall temperature at which this process is carried out is sufficiently high in order to form a metal-rich liquid zone 16 shown in FIG. 7 in the form of a line or sheet. This liquid zone 16 is caused to migrate through the semiconductor wafer 14 from the cooler end of the structure to the hotter end thereof leaving in its path a recrystallized region of semiconductor material containing the metal and solid solution within the semiconductor material in a predetermined concentration. Since the single-crystal semiconductor wafer 14 acts merely as a support for the dielectrically-isolated single-crystal semiconductor regions 101, 102 and 103, the metal present in wafer 14 at the end of the thermomigration process does not affect the properties of the isolated semiconductor regions. At most, the conductivity and doping of wafer 14 is somewhat modified after the completion of the thermomigration process. As mentioned above, the choice of aluminum as intermediate metallic body is advantageous due to its low melting point of about 650° C. and its eutectic temperature with silicon of about 610° C. Moreover, since aluminum is often used as a p-type dopant for n-type silicon, the presence of aluminum in wafer 14 at the end of the migration process merely changes its conductivity. Also, by keeping the first wafer 10 on the cold side of the temperature gradient, the properties of the individual semiconductor regions 101, 102 and 103 are not affected by the thermomigration step.

Figure 7:
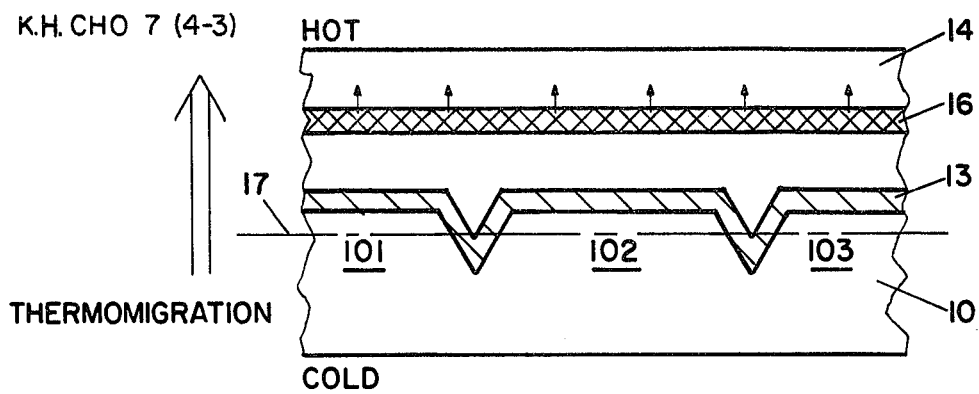
Figure 8:
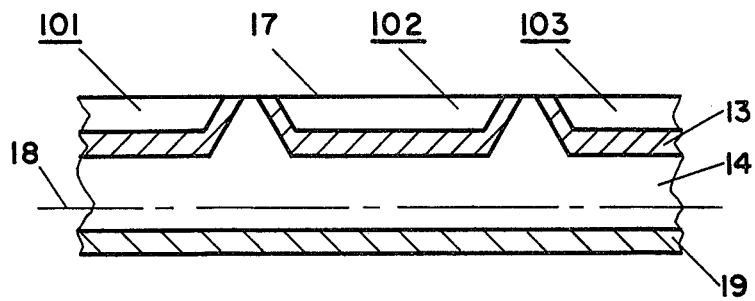

The next step of the present method as shown in FIG. 8 consists in removing material from the first wafer 10 along line 17 in FIG. 7 until the spaced-apart grooves 11 and 12 are exposed. Such a material removing step results in the formation of a plurality of single-crystal semiconductor islands 101, 102 and 103 isolated from each other, and each isolated from the support wafer 14 by means of dielectric film 13. The foregoing material removing step may be an etching, lapping, polishing or other well known semiconductor material removing process or any combination thereof. Furthermore, an optional step of removing the migrated metallic layer 19 from the second wafer 14 may be added to the method. As just mentioned with respect to the material removing step, the migrated metallic layer 19 may, for example, be lapped or etched along line 18 of FIG. 8.

Figure 9:
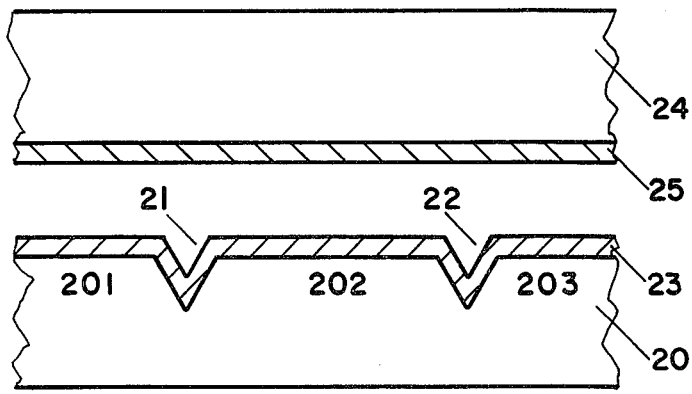
FIG. 9 shows an alternative embodiment for the intermediate metallic body of FIGS. 1 and 5.

One alternative embodiment for the metallic body 4 or 15 in FIGS. 1 or 5, respectively, is shown in FIG. 9 wherein a single-crystal semiconductor wafer 20 has grooves 21 and 22 defining regions 201, 202, 203, and a dielectric film 23 of the type described above in connection with wafer 10 of FIG. 5. Although wafer 20 is shown as having a grooved major surface, this one alternative embodiment described herein is applicable as well to non-grooved single-crystal wafers, i.e, to single-crystal wafers similar to wafer 1 of FIG. 1. Also shown in FIG. 9 is a second single-crystal semiconductor wafer 24 similar to wafers 3 and/or 14 in FIGS. 1 and/or 5, respectively. However, wafer 24 differs from the latter in that a thin metallic layer 25 is formed on one of its major surfaces. Metallic layer 25 formed on wafer 24 is one substitute for the metallic body interposed between the two single-crystal wafers of FIGS. 1 and 5. Layer 25 may be formed by means of a chemical vapor deposition process, a sputtering process, or any other known method for coating or depositing metal on a semiconductor surface. The subsequent steps of the present method, explained with reference to the one embodiment shown in FIGS. 2 to 4 or the other embodiment shown in FIGS. 6 to 8, are applicable as well to the structure shown in FIG. 9. For the reasons discussed above, layer 25 preferably contains aluminum.

Figure 10:
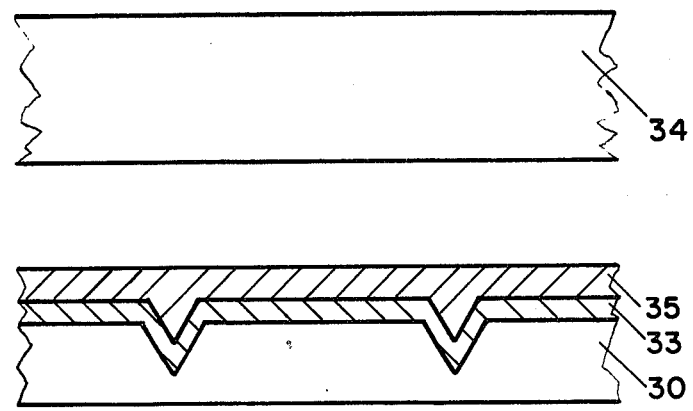
FIG. 10 shows another alternative embodiment for the intermediate metallic body of FIGS. 1 and 5.

Another substitute or alternative embodiment for the metallic body interposed between the two single-crystal wafers is shown in FIG. 10 wherein a thin metallic layer 35 is formed on a dielectric film 33 deposited on the major surface of single-crystal wafer 30. The latter is shown as having a pair of grooves. However, this other alternative embodiment is applicable as well to non-grooved single-crystal wafers, i.e., to single-crystal wafers similar to wafer 1 of FIG. 1. A second single-crystal semiconductor wafer 34, similar to wafers 3 and/or 14 in FIGS. 1 and/or 5, respectively, is used to complete the four layer structure discussed above. The subsequent steps of the present method, as explained above with reference to the embodiments shown in FIGS. 2 to 4 or 6 to 8 are also applicable to the four layer structure shown in FIG. 10. For the same reasons as the one discussed in connection with metallic bodies 4 and 15, the thin metallic layer 35 preferably contains aluminum.

It is to be understood that the embodiments described herein are merely illustrative of the principles of the invention. Various modifications may be made thereto by persons skilled in the art without departing from the spirit and scope of the invention.

What is claimed is:

1. Method of manufacturing dielectrically-isolated single-crystal semiconductor island regions for semiconductor integrated circuits comprising the steps of:
   contacting a first single-crystal semiconductor wafer having a dielectrically-coated major surface with spaced-apart grooves therein and a major surface of a second single-crystal semiconductor wafer with an intermediate thin metallic body positioned therebetween;
   heating the contacted structure to join said first and said second single-crystal wafer and to fill the dielectrically-coated spaced-apart grooves with metal from the thin metallic body;
   thermomigrating the metal of said thin metallic body through and out of said second single-crystal wafer and recrystallizing the second single-crystal wafer into a single-crystal semiconductor support region; and
   removing material from the surface opposite said grooved major surface of the first wafer until said spaced-apart grooves are exposed thereby forming single-crystal island regions supported by the recrystallized single-crystal semiconductor support region.

2. The method according to claim 1 wherein said thin metallic body comprises a thin metallic layer formed on said major surface of said second wafer.

3. The method according to claim 1 wherein said thin metallic body comprises a thin metallic layer formed on said dielectrically-coated grooved major surface of said first wafer.

4. The method according to claims 1, 2 or 3 wherein the intermediate thin metallic body comprises aluminum.

5. The method according to claim 1 further comprising the step of removing the thermomigrated metal layer from the recrystallized single-crystal semiconductor support region.

6. Method of manufacturing dielectrically-isolated single-crystal semiconductor island regions for semiconductor integrated circuits comprising the steps of:
   forming a four layer structure comprising a first layer including a single-crystal semiconductor wafer having spaced-apart grooves on a major surface thereof, a second layer including dielectric material adjoining said first layer, a third layer including metal adjoining said second layer, and a fourth layer adjoining said third layer and including a second single-crystal semiconductor wafer;
   heating the four layer structure to a temperature above the eutectic temperature of said third layer and said fourth layer to fill said spaced-apart grooves with metal from said third layer;
   thermomigrating the metal of said third layer through and out of said fourth layer and recrystallizing said fourth layer into a single-crystal semiconductor support region for said first layer; and
   removing material from said first layer from the surface opposite said grooved major surface thereof until said spaced-apart grooves are exposed thereby forming single-crystal island regions supported by the recrystallized single-crystal semiconductor support region.

7. Method of manufacturing dielectrically-isolated single-crystal semiconductor island regions for semiconductor integrated circuits comprising the steps of:
   forming spaced-apart grooves on the major surface of a first single-crystal semiconductor wafer;
   forming a dielectric film on said major surface of said first wafer;
   forming a thin metallic layer on the major surface of a second single-crystal semiconductor wafer;
   contacting the grooved surface of said first wafer with the metallized surface of said second wafer;
   heating the contacted structure to join said first and said second single-crystal wafer and to fill said spaced-apart grooves with metal from said thin metallic layer;
   thermomigrating the metal of said thin metallic layer through and out of said second single-crystal wafer and recrystallizing the second single-crystal wafer into a single-crystal semiconductor support region;
   removing material from the surface opposite said grooved major surface of said first wafer until said spaced-apart grooves are exposed thereby forming single-crystal island regions supported by the recrystallized single-crystal semiconductor support region; and
   removing the thermomigrated metal layer from the recrystallized single-crystal semiconductor support region.

* * * * *